United States Patent
Tope et al.

(10) Patent No.: US 10,236,899 B1
(45) Date of Patent: Mar. 19, 2019

(54) TUNABLE FRACTIONAL PHASE LOCKED LOOP

(71) Applicant: Allegro MicroSystems, LLC, Manchester, NH (US)

(72) Inventors: Mackenzie Tope, West Manchester, NH (US); Kapil Kesarwani, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/902,172

(22) Filed: Feb. 22, 2018

(51) Int. Cl.
| | |
|---|---|
| *H03L 7/06* | (2006.01) |
| *H03L 7/10* | (2006.01) |
| *H03L 7/099* | (2006.01) |
| *H03L 7/087* | (2006.01) |
| *H03L 7/093* | (2006.01) |

(52) U.S. Cl.
CPC .............. *H03L 7/102* (2013.01); *H03L 7/087* (2013.01); *H03L 7/093* (2013.01); *H03L 7/0992* (2013.01); *H03L 7/0994* (2013.01)

(58) Field of Classification Search
CPC ....... H03L 7/102; H03L 7/0994; H03L 7/087; H03L 7/093; H03L 7/0992
See application file for complete search history.

(56) References Cited

U.S. PATENT DOCUMENTS

| | | | | |
|---|---|---|---|---|
| 6,710,951 B1 * | 3/2004 | Cloke | ................ | G11B 5/59633 360/29 |
| 7,911,247 B2 * | 3/2011 | Xu | ......................... | H03L 7/1974 327/156 |
| 8,704,567 B2 * | 4/2014 | Ainspan | .................. | H03L 7/087 327/149 |
| 8,779,817 B2 * | 7/2014 | Jakobsson | ............. | H03L 7/0805 327/149 |
| 9,484,936 B2 * | 11/2016 | Waheed | .................. | H03L 7/099 |
| 9,628,262 B1 * | 4/2017 | Moe | ...................... | H04L 7/0331 |
| 2016/0363638 A1 | 12/2016 | Daubert | | |

OTHER PUBLICATIONS

U.S. Appl. No. 15/397,409, filed Jan. 3, 2017, Kesarwani.

* cited by examiner

*Primary Examiner* — Kenneth B Wells
(74) *Attorney, Agent, or Firm* — Daly, Crowley, Mofford & Durkee, LLP

(57) ABSTRACT

A tunable fractional phase locked loop (PLL) (hereinafter "tunable PLL") is described herein and includes a controller configured to tune the tunable PLL to a range of frequencies corresponding to a frequency of the input clock signal. The tunable PLL includes a phase detector configured to receive an input clock signal and a feedback signal, a voltage controller oscillator (VCO) configured to receive the error signal from said phase detector and in response thereto to generate a VCO clock signal, a controller configured to generate a dithered division ratio having an average value corresponding to a ratio of a number of edges of the VCO clock signal generated in a cycle of the input clock signal, and a feedback module configured to generates a feedback signal to tune the PLL such that the PLL operates in the range of input frequencies of the input clock signal.

28 Claims, 8 Drawing Sheets

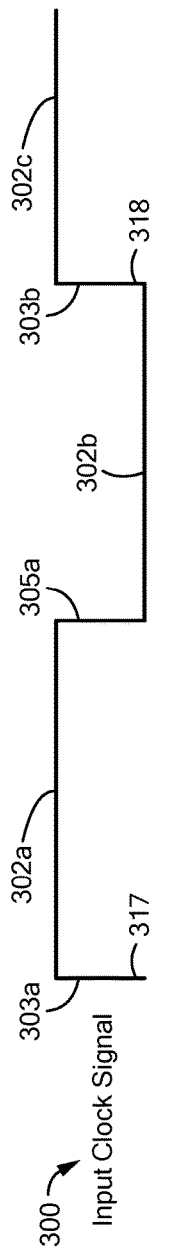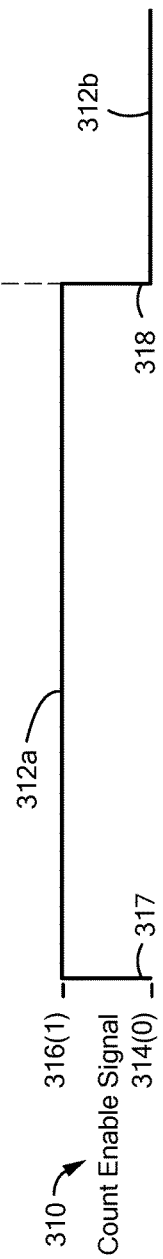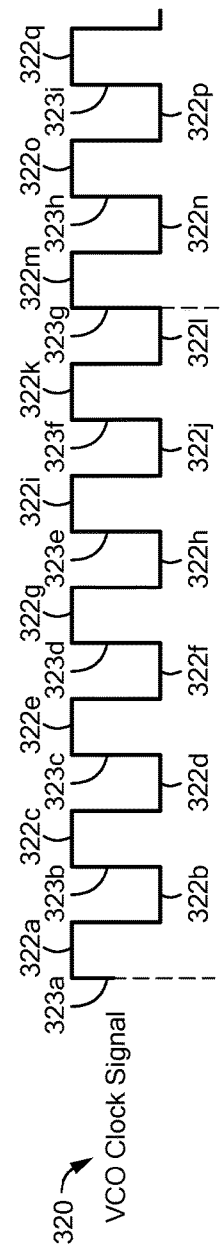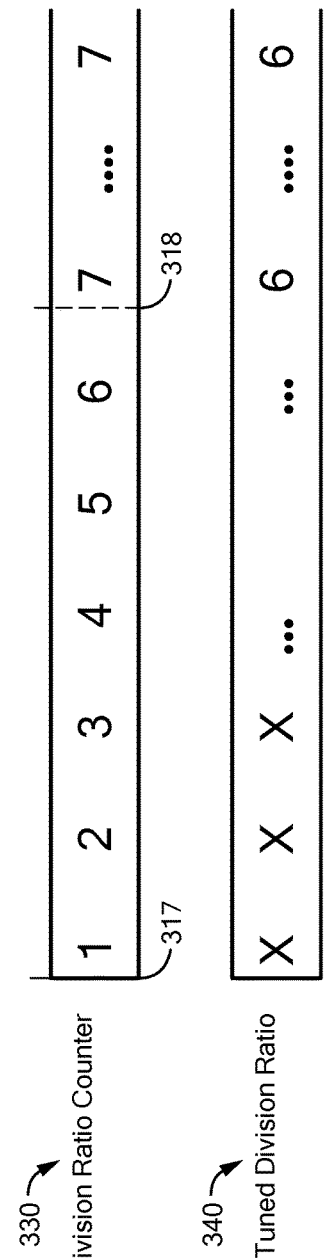

TUNABLE FRACTIONAL PHASE LOCKED LOOP

BACKGROUND

As is known in the art, switch mode power supply signals can emit a large amount of noise. However, the noise can negatively affect electrical circuits, such as those in electromagnetic interference (EMI) sensitive applications, and needs to be reduced to acceptable levels. One technique to reduce noise is the use of a phase locked loop (PLL) and frequency dithering, where spectral content is spread over a frequency band and the magnitude of the noise generated by the respective signals is reduced. For example, frequency dithering can be used to spread the energy of a signal over a band of frequencies instead of allowing that energy to persist at one frequency and potentially cause a spur. However, the band of frequencies is limited by the bandwidth of the components of the particular PLL.

SUMMARY

In accordance with the concepts, systems, methods and techniques described herein a tunable fractional phase locked loop (PLL) (hereinafter "tunable PLL") is provided that can tune itself to a frequency of an input clock to accommodate a wider range of input frequencies as compared with other fractional PLL's.

The tunable PLL can include a controller that can be coupled to receive the input clock signal and a voltage controller oscillator (VCO) clock signal from a VCO of the tunable PLL. The controller can generate a dithered division ratio corresponding to the input clock signal and the VCO clock signal and provide the dithered division ratio to a feedback module that applies the dithered division ratio back into the tunable PLL to tune the tunable PLL to the input clock signal.

By tuning the tunable PLL to the input clock signal, the tunable PLL can use a high frequency VCO topology without the drawbacks of a low bandwidth or tuning range as compared with other fractional PLL's, and thus make use of a high frequency oscillator to accommodate high input frequencies (e.g., up to a quarter of the VCO frequency) without suffering from possible drawbacks of oscillators having a narrow oscillator bandwidth. By tuning, a tunable PLL has no fundamental lower limit to the input frequency.

The controller can include a tuning module, a dither signal generator and a sigma delta modulator. The tuning module can be coupled to receive the input clock signal and a voltage controlled oscillator (VCO) clock signal from a VCO of the tunable PLL. The tuning module can generate a tuned division ratio corresponding to a number of edges (e.g., rising edges, falling edges) of the VCO clock signal generated per cycle of the input clock signal. The dither signal generator can be coupled to receive the tuned division ratio and generate a dithered division ratio that alternates between a positive direction and a negative direction about an average value of the tuned division ratio by a predetermined percentage value. The sigma delta modulator is coupled to receive the dithered division ratio and provide the dithered division ratio to a feedback module.

The feedback module can be coupled to receive the dithered division ratio and generate a feedback signal to tune the tunable PLL to a range of input frequencies of the input clock signal. In an embodiment, a frequency of the VCO can be maintained within a VCO frequency range.

The proposed design is a tunable fractional phase locked loop (PLL) which tunes the PLL to the input frequency which largely relieves the design limitations of the PLL when considering a wide range of input frequencies.

In a first aspect a tunable fractional phased lock loop (PLL) includes a phase detector configured to receive an input clock signal having a range of input frequencies and a feedback signal, wherein the phase detector generates an error signal corresponding to a phase difference between the input clock signal and feedback signal, a voltage controller oscillator (VCO) configured to receive the error signal from said phase detector and in response thereto to generate a VCO clock signal, a controller configured to receive an input clock signal and a VCO clock signal and to generate a dithered division ratio having an average value corresponding to a ratio of a number of edges of the VCO clock signal generated in a cycle of the input clock signal, and a feedback module configured to receive the VCO clock signal and the dithered division ratio and in response thereto generates a feedback signal to tune the PLL such that the PLL operates in the range of input frequencies of the input clock signal.

The PLL can include a loop filter disposed in a signal path between the phase detector and the VCO, the loop filter configured to receive the error signal and generate a filtered signal. A charge pump can be disposed in a signal path between the phase detector and loop filter. The loop filter can include at least one resistive element, at least one capacitive element or a combination of both.

An output module can be coupled to an output of the VCO. The output module can be configured to divide the VCO clock signal to a relative frequency within the range of input frequencies of the input clock signal.

The controller can include a tuning module configured to receive the input clock signal and the VCO clock signal and generate a tuned division ratio corresponding to the ratio between the number of edges of the VCO clock signal generated in the cycle of the input clock signal. The controller can further include a dither signal generator configured to receive the tuned division ratio and generate the dithered division ratio. The dithered division ratio can modulate a predetermined percentage above the average value corresponding to the ratio between the number of edges of the VCO clock signal generated in the cycle of the input clock signal.

The controller can include a sigma delta modulator configured to receive the dithered division ratio. The sigma delta modulator can be configured to implement fractional division ratios and provide noise shaping on the dithered division ratio.

In another aspect, a phased lock loop controller includes a tuning module configured to generate a generate a tuned division ratio corresponding to a ratio between a number of edges of a voltage controller oscillator (VCO) clock signal generated in a cycle of an input clock signal, a dither signal generator configured to receive the tuned division ratio and generate a dithered division ratio that alternates between a positive direction and a negative direction about an average value of the tuned division ratio by a predetermined percentage value, and a sigma delta modulator configured to receive the dithered division ratio and generate an output signal corresponding to the dithered division ratio.

The tuning module can include an activation module and a counter. The activation module can be configured to receive the input clock signal and the counter is configured to receive the VCO clock signal. The activation module can be configured to the counter and the activation module is configured to activate the counter responsive to a first positive edge of the input clock signal and disable the counter responsive to a second positive edge of the input clock signal. The counter can be configured to count a number of positive edges in the VCO clock signal corresponding to the cycle of the input clock signal.

The dither signal generator can include an accumulator module and an integrator. The accumulator module can be configured to generate an accumulation constant and the integrator can be configured to linearly ramp the tuned division ratio responsive to the accumulator constant.

In another aspect, a method for tuning a phased lock loop is provided. The method includes receiving, at a phase detector, an input clock signal and a feedback signal, wherein the input clock signal includes an input voltage and a range of input frequencies, receiving, at a voltage controlled oscillator (VCO) from the phase detector, an error signal corresponding to a phase difference between the input clock signal and the feedback signal, generating, by the VCO, a VCO clock signal having an output frequency corresponding to the input voltage, and comparing the input clock signal to the VCO clock signal.

Comparing further includes determining a number of edges of the VCO clock signal generated during a cycle of the input clock signal, generating a tuned division ratio corresponding to a ratio between the number of edges of the VCO clock signal generated during the cycle of the input clock signal, generating a dithered division ratio that modulates the average value of the tuned division ratio a predetermined percentage value, and generating a feedback signal corresponding to the dithered division ratio. The feedback signal can tune the PLL to the range of input frequencies of the input clock signal.

The input voltage can be maintained at a constant level to maintain the VCO output clock signal within the VOC frequency range. In some embodiments, responsive to a first positive edge of the input clock signal, counting of a number of positive edges of the VCO clock signal generated during the cycle of the input clock signal can be initiated, and responsive to a second positive edge of the input clock signal, counting of the number of positive edges of the VCO clock signal can be stopped. The number of positive edges of the VCO clock signal in one cycle of the input clock signal can correspond to a ratio of the VCO clock frequency to the input signal frequency.

An accumulator constant can be generated corresponding to the predetermined percentage value. The accumulator constant can alternate from a positive to a negative value. In some embodiments, the tuned division ratio can be linearly ramped using the accumulator constant to generate the dithered division ratio.

The dithered division ratio can include a triangular waveform that alternates from a positive value to a negative value about the average value of the tuned division ratio. The accumulator constant can be a fraction of the average value of the tuned division ratio.

In another aspect, a tunable fractional phased lock loop (PLL) includes a means for detecting configured to receive an input clock signal having a range of input frequencies and a feedback signal, wherein the means for detecting generates an error signal corresponding to a phase difference between the input clock signal and feedback signal, a means for filtering configured to receive the error signal and generate a filtered signal, a means for generating configured to receive the filtered signal and generate a VCO clock signal corresponding to the filtered signal, a means for controlling configured to generate a dithered division ratio having an average value corresponding to a ratio between a number of edges of the VCO clock signal generated in a cycle of the input clock signal, and the feedback means configured to receive the dithered division ration and generate a feedback signal to tune the PLL to the range of input frequencies of the input clock signal.

The PLL can include a charge pump disposed in a signal path between the means for detecting and the means for filtering. The means for filtering can include at least one resistive element, at least one capacitive element or a combination of both. An output module can be coupled to an output of the means for generating. The output module can be configured to divide the VCO clock signal down to at least one input frequency of the range of input frequencies of the input clock signal.

The means for controlling can include a means for tuning configured to receive the input clock signal and the VCO clock signal and generate a tuned division ratio corresponding to the ratio between a number of edges of the VCO clock signal generated in a cycle of the input clock signal. The means for controlling can include a means for signal generation configured to receive the tuned division ratio and generate the dithered division ratio. The dithered division ratio can modulate a predetermined percentage above the average value corresponding to a ratio between a number of edges of the VCO clock signal generated in a cycle of the input clock signal.

The means for controlling can include a sigma delta modular configured to receive the dithered division ratio. The sigma delta modulator can be configured to implement fractional division ratios and provide noise shaping on the dithered division ratio.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements:

FIG. 3 shows a plot of an input clock signal;

FIG. 3A shows a plot of a count enable signal corresponding to the input clock signal of FIG. 3;

FIG. 3B shows a plot of a voltage controlled oscillator (VCO) clock signal;

FIG. 3C shows an output of a division ratio counter responsive to the input signal of FIG. 3 and the VCO clock signal of FIG. 3B;

FIG. 3D shows an output of a division ratio final value responsive to the output of the division ratio counter of FIG. 3C, the input signal of FIG. 3 and the VCO clock signal of FIG. 3B;

DETAILED DESCRIPTION

A tunable fractional phase locked loop (PLL) (hereinafter "tunable PLL") is described herein and includes a controller configured to tune the tunable PLL to a range of frequencies corresponding to a frequency of the input clock signal. The controller can generate a division ratio corresponding to a ratio between a frequency of the input clock signal and a frequency of a voltage controlled oscillator (VCO) signal and apply dither to the division ratio to generate a time varying signal having a generally triangle waveform. The time varying signal having a generally triangle waveform, referred to herein as a dithered division ratio, can be provided to a feedback module and then fed back into the tunable PLL to tune the PLL to the frequency of the input clock signal. Thus, the tunable PLL can be tuned to keep the VCO within at a predetermined frequency or range of frequencies regardless of the frequency of the input clock signal by altering an average value of the dithered division ratio to match different possible frequencies of the input clock signal.

As used herein a positive edge may refer to a rising edge of a pulse of a signal and/or a transition of a signal from a first state (low level) to a second state (high level). As used herein a negative edge may refer to a falling edge of a signal and/or a transition of a signal from the second state (high level) to the first state (low level).

Figure 1:
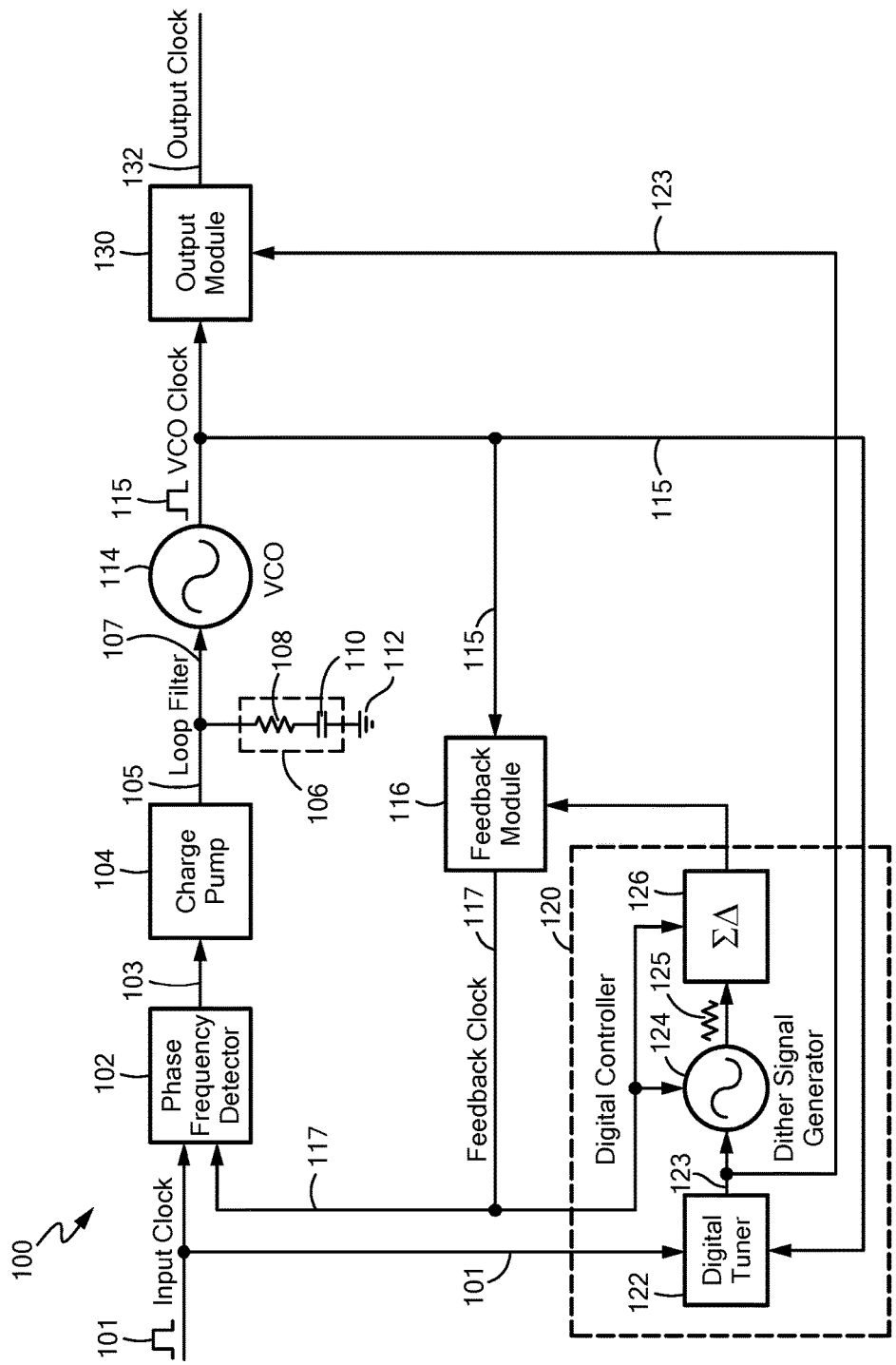
FIG. 1 shows a block diagram of a tunable fractional phase locked loop (PLL) having a controller coupled to a feedback module.

Now referring to FIG. 1, a tunable PLL 100 includes a phase and frequency detector 102 coupled to receive an input clock signal 101 through a first input and a feedback clock signal 117 through a second input.

Phase and frequency detector 102 can compare the input clock signal 101 to the feedback clock signal 117 and generate an error signal 103 that is proportional to the difference between input clock signal 101 with feedback clock signal 117. Error signal 103 may correspond to a phase difference or a frequency difference between the input clock signal 101 and the feedback clock signal 117. In some embodiments, feedback clock signal 117 may be used as a reference signal to tune tunable PLL 100 to a range of input frequencies of input clock signal 101, as will be described in greater detail below.

An output of phase and frequency detector 102 is coupled to an input of a charge pump 104 to provide error signal 103 to charge pump 104. In some embodiments, charge pump 104 can be configured to modify a voltage level of error signal 103. For example, charge pump 104 may include one or more current sources and operate as a bipolar switched current source to generate a charge pump signal 105. In an embodiment, charge pump signal 105 may include one or more current pulses (e.g., positive current pulse, negative current pulse, or a combination of both) corresponding to error signal 103.

An output of charge pump 104 is coupled to an input of loop filter 106 to provide charge pump signal 105 to loop filter 106. In the illustrative embodiment of FIG. 1, loop filter 106 includes a resistive element 108 (e.g., resistor) and a capacitive element 110. A first terminal of resistive element 108 is coupled to receive charge pump signal 105 and a second terminal is resistive element 108 is coupled to a first terminal of capacitive element 110. A second terminal of capacitive element 110 is coupled to a ground reference terminal 112. However, it should be appreciated that loop filter 106 can be formed in a variety of different ways and/or may include different combination of components than those illustrated in FIG. 1 and those of ordinary skill in the art will understand how to select components for loop filter 106 and/or to design loop filter 106 for a particular application of tunable PLL 100.

Loop filter 106 can be configured to filter (e.g., low pass filtering) and extract unwanted frequency content (e.g., noise) from charge pump signal 105 and generate filter signal 107. Filter signal 107 may be provided as a voltage waveform and can be used to control a frequency of a voltage controlled oscillator (VCO) 114. In an embodiment, filter signal 107 may be provided as a voltage corresponding to the phase or frequency difference between input clock signal 101 and the feedback clock signal 117.

The properties of filter signal 107 may depend on whether or not tunable PLL 100 has been tuned. For example, when tunable PLL 100 is being tuned, tunable PLL 100 can be provided a reference voltage from loop filter 106. After tunable PLL 100 has been tuned, the filter signal 107 can correspond to a voltage signal generated by loop filter 106.

An output of loop filter 106 is coupled to an input of VCO 114 to provide filter signal 107. VCO 114 can be configured to generate a VCO clock signal 115 having a frequency proportional to the filter signal 107.

Outputs of VCO 114 can be coupled to an input of an output module 130, an input of a feedback module 116 and an input of a digital tuner 122 of a controller 120 to provide VCO clock signal 115 to each of them. Output module 130 can be configured to generate an output clock signal 132 corresponding to an output of tunable PLL 100. In some embodiments, output module 130 can modify the VCO clock signal 115 to generate the output clock signal 132 such that output clock signal 132 has a frequency that is the same as the frequency of the input clock signal or within a predetermined range. For example, in one embodiment, output module 130 can divide VCO lock signal 115 in relation to an absolute input frequency (e.g., a specific input frequency as opposed to a range of input frequencies). In such an embodiment, the tunable PLL 100 can tune itself to the particular input frequency at that particular time period.

Controller 120 can include a tuning module 122, a dither signal generator 124, and a sigma delta module 126. As illustrated in FIG. 1, a first input of tuning module 122 is coupled to receive input cock signal 101 and a second input of tuning module is coupled to receive VCO clock signal 115. Tuning module 122 can generate, responsive to input cock signal 101 and VCO clock signal 115, a tuned division ratio 123. Tuning module 122 will be described in greater detail below with respect to FIG. 2.

An output of tuning module 122 is coupled to a first input of dither signal generator 124 and a second input of dither signal generator 124 can be coupled to receive a feedback signal 117 from feedback module 116. The feedback signal 117 will be described in greater detail below with respect to feedback module 116.

Dither signal generator 124 can be configured to generate a dithered division ratio 125. In an embodiment, dithered division ratio 125 can be a dithered version of tuned division ratio 123. Dither signal generator 124 will be described in greater detail below with respect to FIG. 4.

An output of dither signal generator 124 is coupled to a first input of sigma delta generator 126 to provide the dithered division ratio 125. A second input of sigma delta generator 126 is coupled to receive feedback signal 117. Sigma delta generator 126 can be configured to implement fractional division ratios as a string of integers and/or can be configured to provide noise shaping for the dithered division ratio 125. For example, sigma delta generator 126 can be configured to modify (e.g., increase) a signal to noise ratio of the dithered division ratio 125 by altering the spectral shape of error that may have been introduced during the dithering performed by dither signal generator 124. An output of sigma delta generator 126 is coupled to a second input of feedback module 116.

A first input of feedback module 116 is coupled to receive VCO clock signal 115 from VCO 114. Feedback module 116 is configured to generate a feedback signal 117 corresponding to properties of VCO clock 115 and dithered division ratio 125. In an embodiment, feedback module 116 can apply the dithered division ratio 125 to the VCO clock signal 115 to tune tunable PLL 100 to a frequency of the input signal. An output of feedback module 116 is coupled to a second input of phase and frequency detector 102.

Each of the components of tunable PLL 100 will be described in greater detail below.

Figure 2:
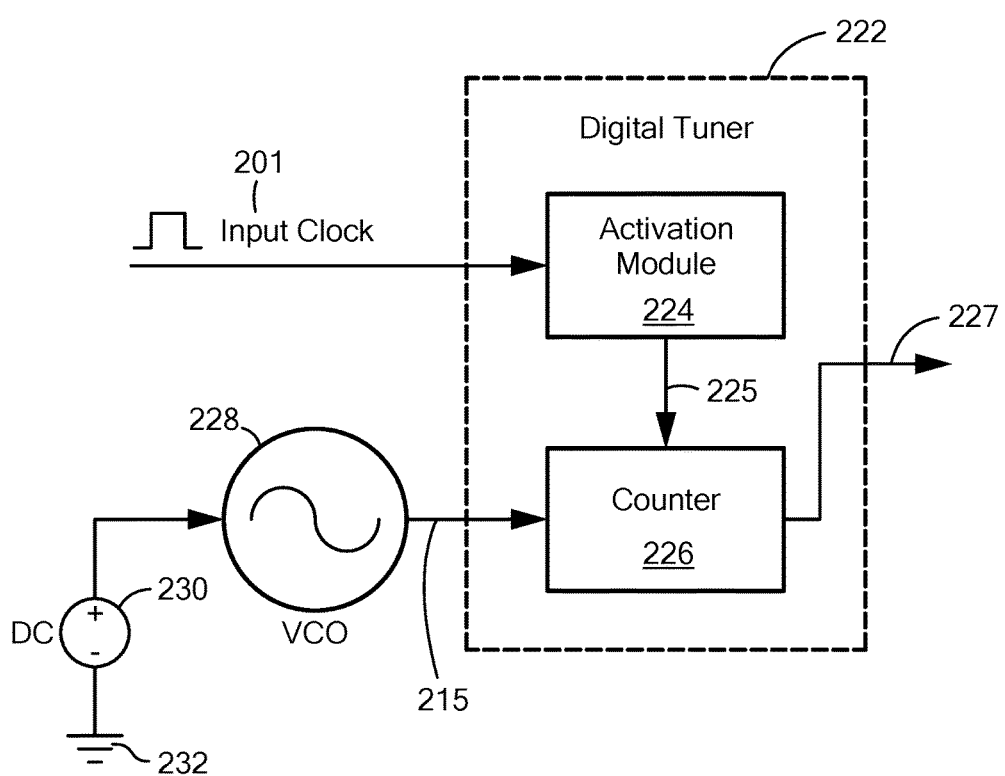
FIG. 2 shows a block diagram of a tuning module of the tunable fractional PLL of FIG. 1.

Now referring to FIG. 2, a tuning module 222 include an activation module 224 and a counter 226. Tuning module 222 may be the same as or substantially similar to tuning module 122 of FIG. 1.

A first input of activation module 224 is coupled to receive an input clock signal 201. Activation module 224 can be coupled to counter 226 and activation module 224 can be configured to activate or disactivate (e.g., enable/disable, turn on/off) counter 226 in response to properties (e.g., positive edge, negative edge, features) of input clock signal 201. For example, in some embodiments, activation module 224 can detect a first (or initial) positive edge of input clock signal 201 and responsive to the first positive edge, activation module 224 can activate counter 226 using properties of a count enable signal 225 (e.g., positive edge of count enable signal 225). Activation module 224 can detect a second (or subsequent) positive edge of input clock signal 201 and responsive to the second (or subsequent) positive edge, activation module 224 can disable counter 226 using properties of the count enable signal 225 (e.g., negative edge of count enable signal 225). Thus, activation module 226 can be configured to activate counter 226 responsive to every other positive edge detected in input clock signal 201 and disable counter 226 responsive to every other different positive edge detected in input clock signal 201.

A first input of counter 226 is coupled to activation module 224 to receive the count enable signal 225 having activation portions and/or disable portions responsive to properties of input clock signal 201. A second input of counter 226 is coupled to receive VCO clock signal 215. In some embodiments, such as during a tuning phase, VCO clock signal 215 can be generated using a voltage source 230 coupled between counter 226 and a ground terminal 232. In other embodiments, VCO clock signal 215 can be generated by a VCO, such as but not limited to VCO 114 and VCO clock signal 215 may be the same as or substantially similar to VCO clock signal 115.

Counter 226 can be activated responsive to a positive edge in count enable signal 225 and thus, responsive to a positive edge of input clock signal 201. In some embodiments, count enable signal 225 is configured such that counter 226 is activated during individual cycles of input clock signal 201. Upon being activated, counter 226 can begin counting (e.g., incrementing a counter) positive edges in VCO clock signal 215 during the respective cycle of input clock signal 201. For example, VCO clock signal 215 can have a frequency the same as or substantially close to a frequency a tunable PLL (e.g., tunable PLL 100 of FIG. 1) can have when it is considered "locked." Counter 226 can increment responsive to each positive edge of VCO clock signal 215 during one cycle of input clock signal 201. The number of positive edges VCO clock signal 215 produces during one cycle of input clock signal 201 can correspond to an estimate of a ratio between the frequency of VCO clock signal 215 and the frequency of input clock signal 201. Stated differently, the number of positive edges VCO clock signal 215 produces during one cycle of input clock signal 201 can be a ratio corresponding to the frequency of VCO clock signal 215 divided by the frequency of the respective tunable PLL.

Tuning module 222 can generate a tuned division ratio 227 corresponding to the ratio between the frequency of VCO clock signal 215 and the frequency of input clock signal 201. Tuning module 222 can be coupled to provide tuned division ratio 227 to a dither signal generator (e.g., dither signal generator 124 of FIG. 1). The tuned division ratio 227 will be described in greater detail below with respect to FIGS. 3-3D.

Now referring to FIG. 3, a plot of an input clock signal 300 is provided. Clock signal 300 may be the same as or substantially similar to clock signal 101 of FIG. 1 or input clock signal 201 of FIG. 2. In the illustrative embodiment of FIG. 3, input clock signal 300 includes three pulses 302a, 302b, 302c with second pulse 302b inverted as compared with first and third pulses 302a, 302c.

First pulse 302a includes a positive edge 303a and a negative edge 305a. As used herein a positive edge 302a may refer to a rising edge of input clock signal 300 and/or a transition of input clock signal 300 from a first state (low level) to a second state (high level). As used herein a negative edge 305a may refer to a falling edge of input clock signal 300 and/or a transition of input clock signal 300 from the second state (high level) to the first state (low level). Third pulse 302a includes a positive edge 303b.

A pair of pulses, here first and second pulses 302a, 302b, may correspond to one cycle of input clock signal 300. Stated differently, a period between each positive edge, here between first positive edge 303a of first pulse 302a and second positive edge 303b of third pulse 302c, may correspond to one cycle of input clock signal 300. As described above with respect to FIG. 2, a tuning module can be configured to detect features and/or properties of input clock signal 300.

Now referring to FIG. 3A, a plot of a count enable signal 310 is provided. Count enable signal 310 can be generated by an activation module, such as activation module 224 of FIG. 2, in response to input clock signal 300.

Count enable signal 310 includes two pulses 312a, 312b with second pulse 312b inverted as compared with first pulse 312a. Count enable signal 310 can transition from a first state 314 (here 0) to a second state 316 (here 1) in response to the first positive edge 303a of input clock signal 300. Count enable signal 310 can maintain its state until a next or subsequent positive edge of input clock signal 300 is detected, here second positive edge 303b of third pulse 302c of input clock signal 300. In an embodiment, count enable signal 300 can transition between states responsive to each positive edge 303a, 303b of input clock signal 300.

For example, and as illustrated in FIG. 3A, at a first-time period 317, input clock signal 300 transitions from the first state 314 to the second state 316 responsive to first positive edge 303a of first pulse 302a. As count enable signal 310 transitions from first state 314 to second state 316, first pulse 312a is generated.

At a second-time period 318, input clock signal 300 transitions from the first state 314 to the second state 316 again responsive to second positive edge 303b of third pulse 302c. Count enable signal 310 can transition from second state 316 to first state 314 to generate second pulse 312b.

In an embodiment, first pulse 312a of count enable signal 310 can correspond to an activation portion of count enable signal 310 and can activate (or turn on) a counter (e.g., counter 226 of FIG. 2) of a tuning module and second pulse 312b of count enable signal 310 can correspond to a disable portion of count enable signal 310 and can disable (or turn off) a counter (e.g., counter 226 of FIG. 2) of a tuning module.

Now referring to FIG. 3B, a plot of a VCO clock signal 320 is provided. VCO clock signal 320 may be the same as or substantially similar to VCO clock signal 115 of FIG. 1 or VCO clock signal 215 of FIG. 2. In the illustrative embodiment of FIG. 3B, VCO clock signal 320 includes seventeen pulses 322a-322q.

In an embodiment, VCO clock signal 320 can have a frequency corresponding to a frequency of a tunable PLL (e.g., tunable PLL 100 of FIG. 1). Thus, by comparing VCO clock signal 320 to input clock signal 300, a ratio between their respective frequencies can be determined and used to tune a tunable PLL to a range of frequencies of the input clock signal 300.

For example, and now referring to FIG. 3C, a division ratio counter 330 is shown. Division ratio counter 330 can correspond to an output of a counter, such as but not limited to counter 226 of FIG. 2.

At first-time period 317, the counter may be activated responsive to count enable signal 310 transitioning to the second state 316 and begin counting (or incrementing) positive edges 323a-323i of VCO signal 320. As illustrated in FIG. 3C, each numeral ("1", "2", etc.) in division ratio counter 330 indicates a counted positive edge from VCO clock signal 320. The counter may continue to count positive edges of VCO signal 320 until the counter is disabled, for example, responsive to count enable signal 310 transitioning to the first 314 at the second-time period 318. Thus, the counter is enabled from first-time period 317 to second-time period 318, which also corresponds to one cycle of input clock signal 300, and during that time, VCO clock signal 320 includes six positive edges 323a-323f Thus, in the illustrative embodiment of FIG. 3C, the division ration counter 330 increments up to 6. It should be appreciated that the values and number of pulses and/or edges shown in FIGS. 3-3D are provided for explanation reasons and that counter division ratio counter 330 can be configured to count any number of features of count enable signal 310 and/or input clock signal 300, based at least in part on their respective properties (e.g., frequency, number of pulses, number of edges, etc.).

At second-time period 318, a seventh positive edge 323g occurs. However, as the counter is disable at second-time period 318, the division ratio counter does not count or increment for the seventh positive edge 323g. Thus, for one cycle of input clock signal 300, VCO clock signal 320 includes six positive edges.

Now referring to FIG. 3D, a tuned division ratio 340 is provided. The tuned division ratio 340 may be the same as or substantially similar to an output of a tuning module, such as but not limited to the tuned division ratio 123 of tuning module 122 of FIG. 1 or the tuned division ratio 227 of tuning module 222 of FIG. 2.

The tuned division ratio 340 can be the ratio between a frequency of VCO input clock signal 320 as compared to a frequency of input clock signal 300. For example, in one embodiment, the tuned division ratio 340 is the ratio of the number of positive edges of VCO input clock signal 320 in one cycle of input clock signal 300, here six.

The tuned division ratio 340 can be stored and saved as an output of a tuning module until a next positive edge (e.g., third positive edge) is detected in input clock signal 300. At such a time, the count enable signal 310 can generate an activation portion to activate the counter of the respective tunable PLL. It should be appreciated that a tunable PLL can continuously monitor and tune itself, responsive to properties of input clock signal 300, using the tuned division ratio 340.

Figure 4:
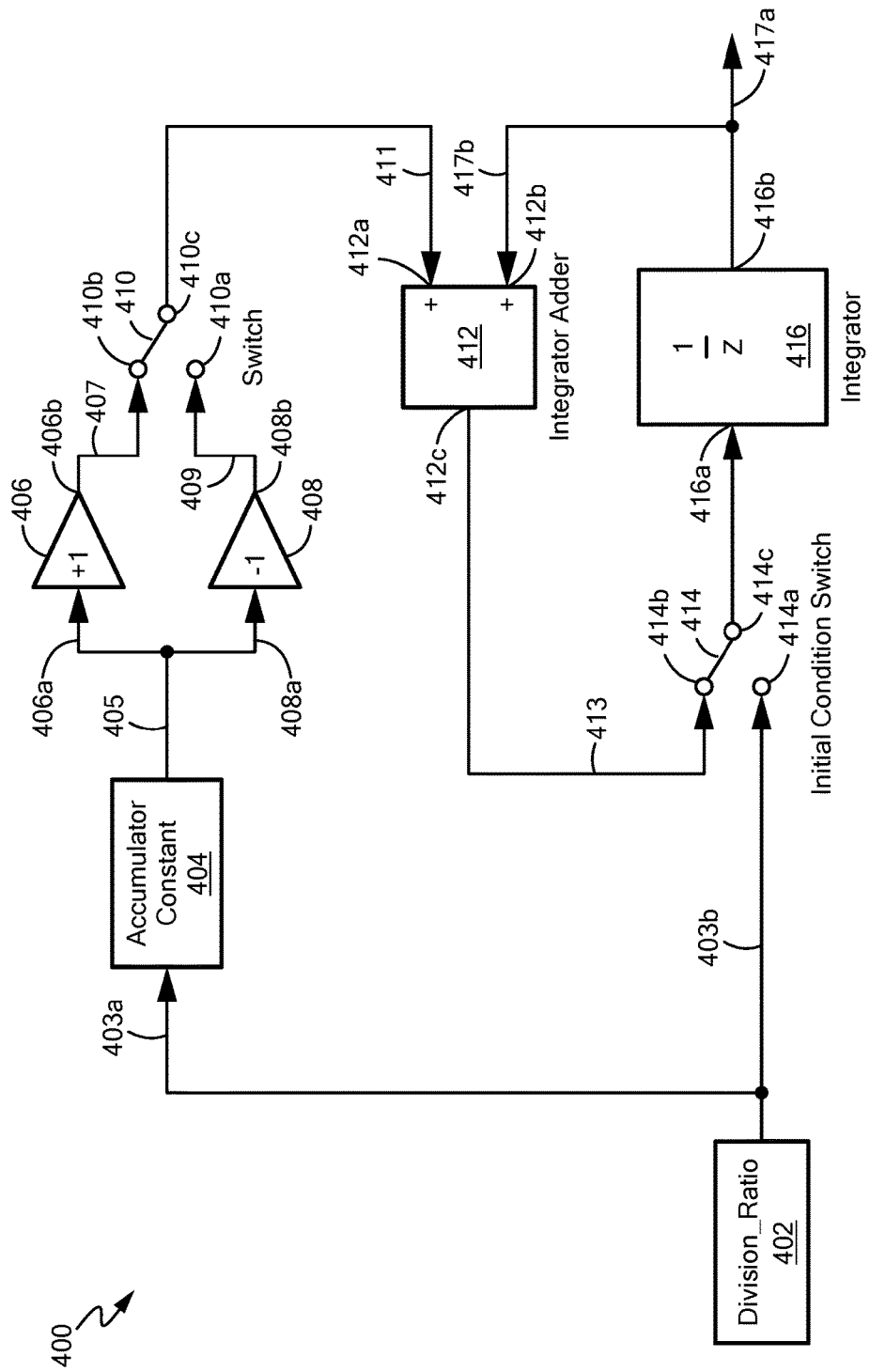
FIG. 4 shows a block diagram of a dither signal generator of the tunable fractional PLL of FIG. 1.

Now referring to FIG. 4, a dither signal generator 400 is shown. Dither signal generator 400 may be the same as or substantially similar to dither signal generator 124 of FIG. 1.

Dither signal generator 400 includes a first switch 414, an integrator 416, an accumulator 404, a first gain module 406, a second gain module 408, a second switch 410 and an adder 412. Dither signal generator 400 can receive as an input, a tuned division ratio 402. In an embodiment, first and second gain modules 406, 408 represent a positive and negative signal path for an accumulator constant 404 generated by accumulator 404. Dither signal generator 400 can be configured to provide a linear change in the tuned division ratio 402 to generate a dither signal 417a. Stated differently, Dither signal generator 400 can add dither to incrementally modify the tuned division ratio 402 about an average value over time by a predetermined dithering percentage. Tuned division ratio 402 may be the same as or substantially similar to tuned division ratio 125 of FIG. 1, tuned division ratio 227 of FIG. 2, and/or tuned division ratio 340 of FIG. 3.

The tuned division ratio can be provided to an input of an accumulator 404 and a first terminal 414a of a first switch 414. Accumulator 404 can be configured to apply a rate of change factor to the tuned division ratio 402 to generate an accumulation constant 405 for the dither signal generator 400. The rate of change factor can vary and can be selected based at least in part on a desired rate of change of a dithered division ratio (e.g., dither signal) for a particular application of a tunable PLL. In some embodiments, the rate of change factor can be selected based at least in part on properties of the frequency of an input clock signal to the tunable PLL.

The accumulator constant 405 can be provided to inputs 406a, 408a of first and gain modules 406, 408, respectively. In some embodiments, first and second gain modules 406, 408 can be positive and negative gain amplifiers respectively and can be coupled in parallel with respect to an output of accumulator 404.

First and second gain modules 406, 408 can be configured to receive accumulator constant 405 generate alternating positive and negative values using second switch 410. For example, first gain module 406 can have a positive gain value (e.g., 1) and apply the positive gain to the accumulator constant 405 to generate a positive accumulator constant 407. Second gain module 408 can have a negative gain value (e.g., −1) and apply the negative gain to accumulator constant 405 to generate a negative accumulator constant 409.

An output 406b of first gain module 406 is coupled to a second terminal 410b of second switch 410 to provide the positive accumulator constant 407 and an output 408b of second gain module 408 is coupled to a first terminal 410a of second switch 410 to provide the negative accumulator constant 409.

Second switch 410 includes a third terminal 410c and can switch between first and second terminals 410a, 410b such that alternating positive and negative accumulator constants are provided to third terminal 410c and an alternating accumulator constant 411 is generated. The rate that second switch 410 switches can vary and can be selected based at least in part on desired properties of a dither signal (referred to herein as a dithered division ratio) for a particular application of a tunable PLL.

Third terminal 410c can be coupled to a first input 412a of adder 412 to provide alternating accumulator constant 411 to adder 412. A second input 412b of adder 412 can be coupled to an output 416b of integrator 416 to receive dithered division ratio 417. Adder 412 can be configured to apply the alternating accumulator constant 411 to the dithered division ratio 417 to incrementally modify the dithered division ratio 417 by the accumulator constant 411 and generate an adder signal 413. In an embodiment, adder signal 413 can correspond to the dithered division ratio 417 increased or decreased by a value corresponding to the alternating accumulator constant 411.

Adder 412 is coupled to a second terminal 414b to provide adder signal 413. As indicated above, first terminal 414a of first switch 414 is coupled to receive tuned division ratio 402. In an embodiment, first switch 414 can detect if predetermined initial conditions have been met. The predetermined initials conditions may include an initial tuning phase of the respective tunable PLL. Thus, the tunable PLL has not generated an output yet and the tuned division ratio 402 may be provided to be an initial or starting point for the tuning process.

In an embodiment, first switch 414 can set an initial condition as opposed to reacting to one. For example, the value in integrator 416 can be set to be the tuned division ratio 402 as an initial condition. This allows for the incremental changes to the dithered division ratio 417 to be centered around the tuned division ratio 402. In such an embodiment, once the tuned division ratio 402 has been calculated, this value is loaded into integrator 416 by coupling (e.g., directly connecting) first terminal 414a to third terminal 414c of first switch 414. Once the integrator 416 has been loaded with the tuned division ratio 402 value, the first switch can transition and couple second terminal 414b to third terminal 414c. First switch can transition back and couple first terminal 414a to third terminal 414c in response to a change in the tuned division ratio 402.

First switch 414 can transition between first terminal 414a and second terminal 414b to provide either tuned division ratio 402 or adder signal 413, respectively, at third terminal 414c. Third terminal 413c can be coupled to an input 416a of integrator 416.

Integrator 416 can include a unit delay and be configured to hold and delay the tuned division ratio 402 or the adder signal 413 provided by first switch 414 for a predetermined sample period or iteration. The sample period (or iteration) can vary and can be selected based at least in part on desired properties of a dither signal [dithered division ratio] for a particular application of a tunable PLL.

Integrator 416 can generate the dithered division ratio 417. As stated above, dithered division ratio 417 can correspond to the tuned division ratio 402 modulated with a predetermined dithering percentage. An output of integrator 416 can provide the dithered division ratio 417 that corresponds to the tuned division ratio 402 or the adder signal 413, depending in part on a position of first switch 416, to an input of a sigma delta modulator (e.g., sigma delta modulator 126 of FIG. 1).

Figure 5:
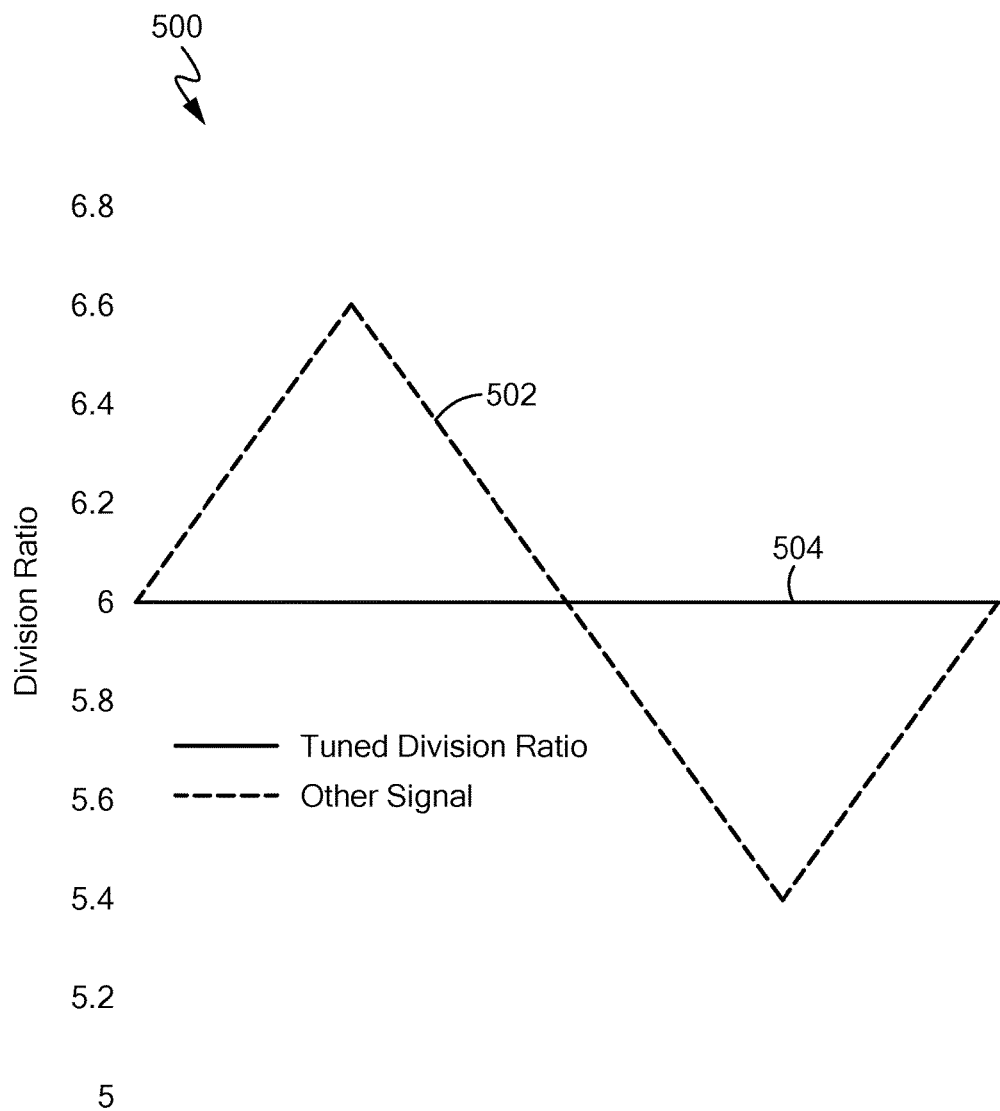
FIG. 5 shows a plot of division ratios versus time comparing a tuned division ratio to a dither signal.

Now referring to FIG. 5, a plot 500 of a division ratio value (vertical axis) versus time (horizontal axis) comparing a tuned division ratio 504 and a dithered division ratio 502.

As illustrated in FIG. 5, the tuned division ratio 504 is a constant value, here 6, representing the number of positive edges in a VCO clock cycle during one cycle of an input clock signal. Dithered division ratio 502 can be a triangle wave that alternates about the tuned division ratio 504 in a positive and negative direction by a predetermined dithering percentage. The rate at which dither division ratio increases relative to tuned division ratio and decreases relative to tuned division ratio can correspond to the alternating accumulator constant 411, described above with respect to FIG. 4. For example, a magnitude of dithered division ratio 502 can correspond to the predetermined dithering percentage. In an embodiment, dithered division ratio 502 can alternates about the tuned division ratio 504 such that an average value of the dithered division ratio 502 is equal to or substantially close to the average value of the tuned division ratio 504.

Figure 6:
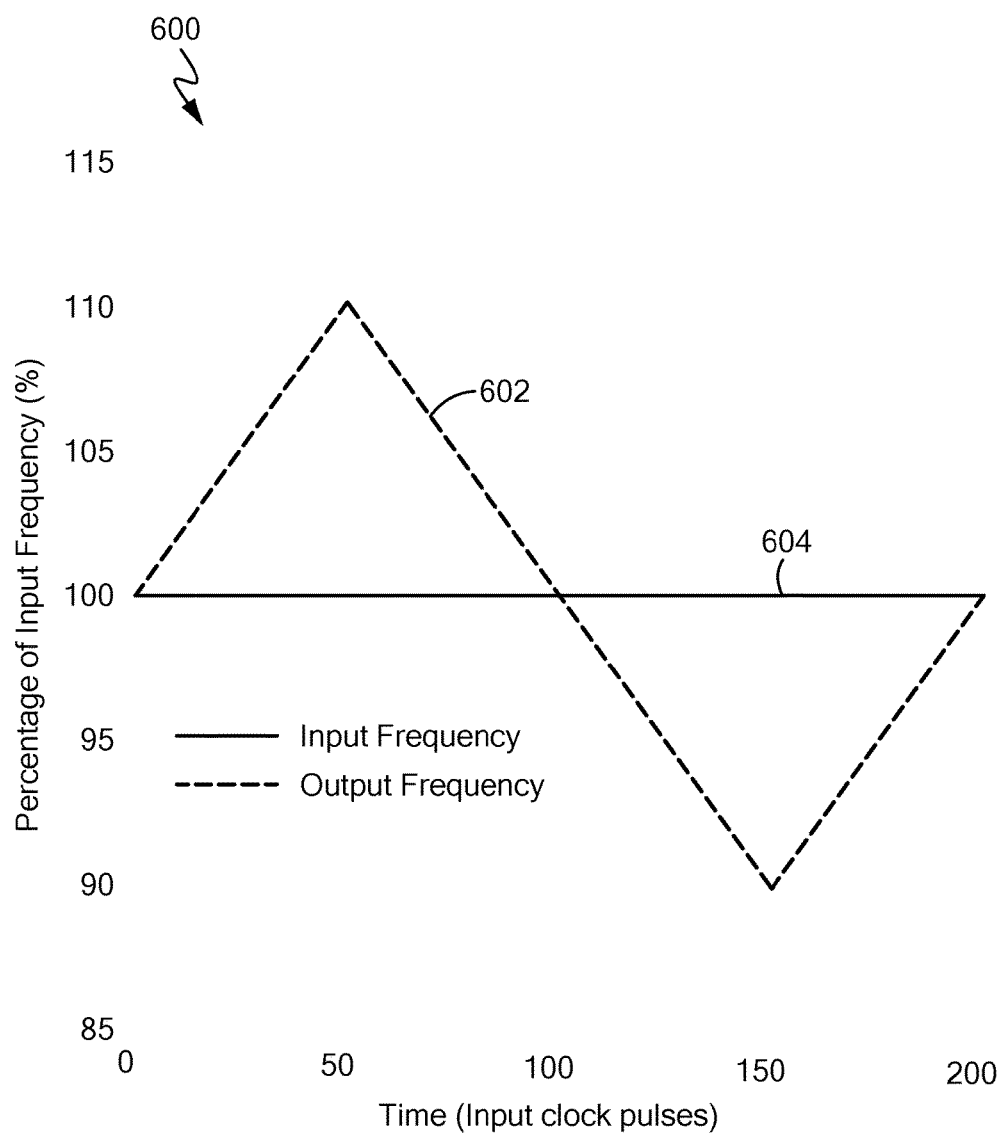
FIG. 6 shows a plot of frequency versus time comparing an input frequency of the tunable fractional PLL to an output frequency of the tunable fractional PLL.

Now referring to FIG. 6, a plot 600 of frequency (vertical axis) versus time (horizontal axis) comparing an input frequency 604 of a tunable fractional PLL to an output frequency 602 of the tunable fractional PLL (e.g., tunable PLL 100 of FIG. 1). The input frequency 602 can correspond to a frequency of an input clock signal (e.g., input clock signal 101 of FIG. 1). and the output frequency can correspond to a frequency of an output clock signal (e.g., output clock signal 132 of FIG. 1).

In particular, plot 600 shows the output frequency 602 as a percentage of the input frequency. Thus, and as illustrated in FIG. 6, input frequency 604 is constant at a value of 100% of the input frequency of the tunable PLL and output frequency 602 increases and decreases about the input frequency 602 at a predetermined rate corresponding to the dithering percentage.

The output frequency 602 of the tunable PLL can be tuned such that it stays within a predetermined percentage or range of frequencies of the input frequency 604 and thus, the corresponding tunable PLL can be tuned to the input frequency 602.

In the illustrative embodiment of FIG. 6, output frequency 602 is dithering over a 10% band (e.g., dithering band) relative to input frequency 604. Thus, output frequency 602 is maintained within the particular dithering band relative to input frequency 604. It should be appreciated that the output frequency 602 can be maintained within a variety of different dithering bands (or dithering percentages) relative to input frequency 604, based at least in part on a particular application of the tunable PLL.

Figure 7:
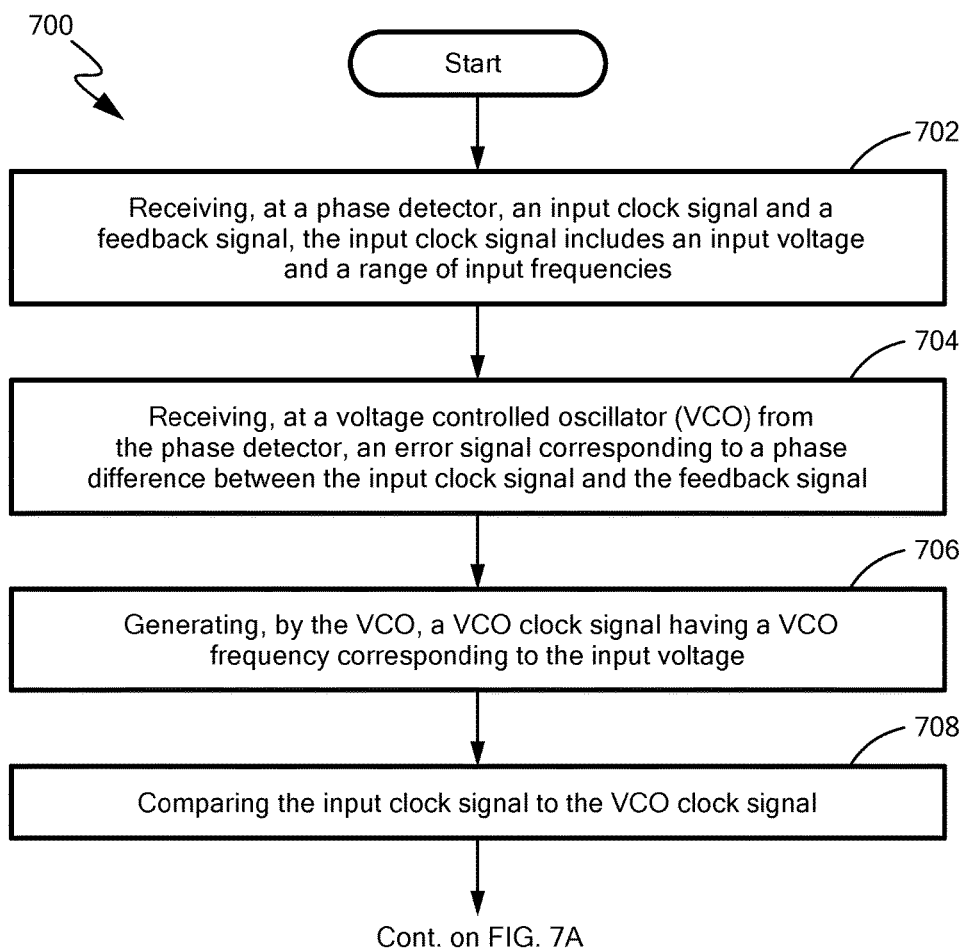
FIGS. 7-7A are a flow diagram of a method for tuning a PLL.
Figure 7A:
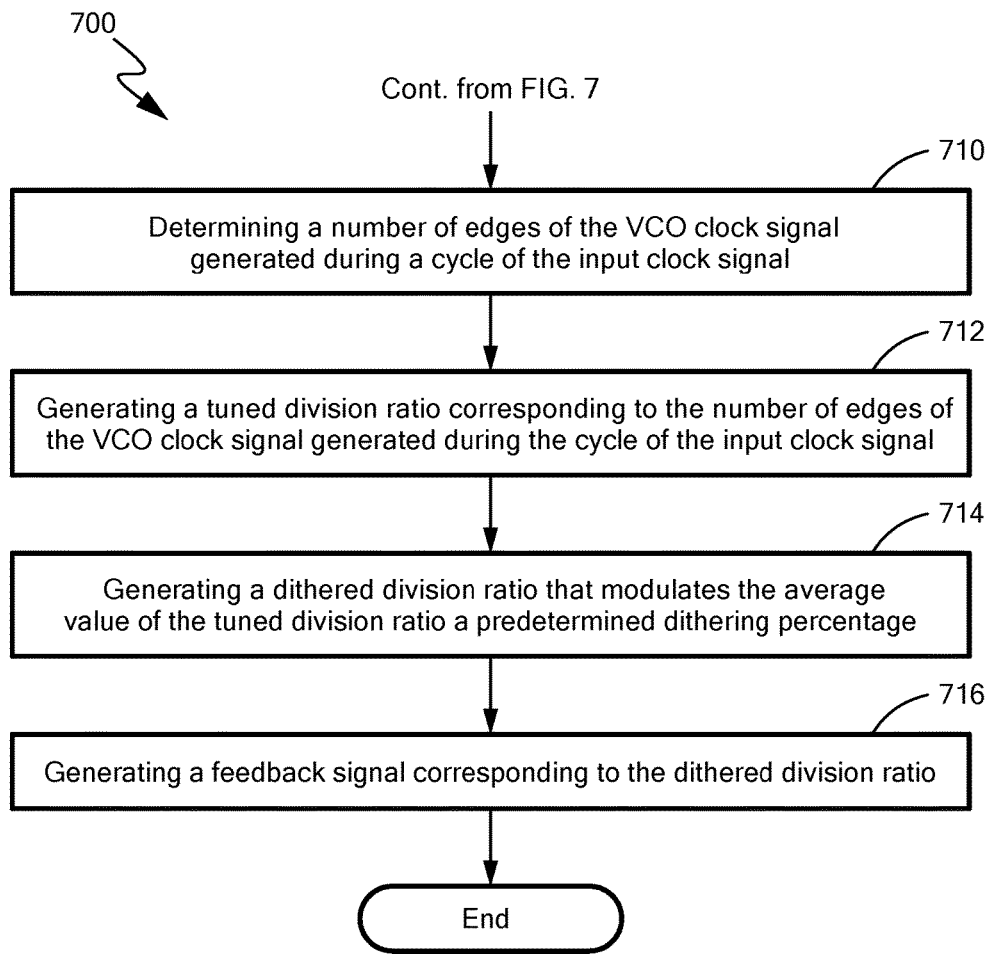

Now referring to FIG. 7, a method 700 for tuning a PLL begins at block 702 by receiving, at a phase detector (e.g., phase and frequency detector), an input clock signal and a feedback signal. The input clock signal can have an input voltage and a range of input frequencies. The phase detector can compare the input clock signal to the feedback clock signal and generate an error signal that is proportional to a phase or frequency difference between the input clock signal and the feedback clock signal. In some embodiments, such as during a tuning phase, the feedback clock signal may be a reference signal used to tune the tunable PLL to the frequency of the input clock signal.

The phase detector can be coupled to a charge pump to provide the error signal. The charge pump can be configured to modify a voltage level of the error signal. For example, the charge pump may include one or more current sources and operate as a bipolar switched current source to generate a charge pump signal. In an embodiment, the charge pump signal may include one or more current pulses (e.g., positive current pulse, negative current pulse, or a combination of both) corresponding to the error signal.

The charge pump can be coupled to an input of a loop filter to provide the charge pump signal. The loop filter can be configured to filter (e.g., low pass filtering) and extract unwanted frequency content (e.g., noise) from the charge pump signal and generate a filter signal. The filter signal may be provided as a voltage waveform and can be used to control a frequency of a VCO. In an embodiment, the filter signal may be provided as a voltage corresponding to the phase or frequency difference between the input clock signal and the feedback clock signal.

At block 704, an error signal can be received at a VCO. The error signal can correspond to a phase difference between the input clock signal and the feedback signal. In some embodiments, the filter signal from the loop filter can be received at the VCO. The filter signal can correspond to the error signal. For example, the filter signal can be a filtered version of the error signal generated by the phase detector.

In some embodiments, during a tuning phase of the tunable PLL, an input voltage can be applied to the VCO. The input voltage can be a constant value selected based in part on a desired operating range of the tunable PLL. In one embodiment, the input voltage can be selected based on desired or expected values during operation of the tunable PLL, for example and without limitation, the input voltage can be selected to be a desired quiescent input voltage of the tunable PLL during normal operation. In an embodiment, the input voltage can be selected such that the input voltage and the VCO output frequency are the same or substantially similar during tuning of the tunable PLL and during operation of the tunable PLL. In some embodiments, the input voltage can be selected such that it is half of a supply voltage provided to the tunable PLL to provide the largest available swing when the tunable PLL becomes locked. It should be appreciated that the input voltage can vary and can be selected based at least in part on a particular design of the tunable PLL and a particular application of the tunable PLL. This may not necessarily be true for every case though. The desired quiescent input voltage may be different for different designs. Some designs may not find the desired value to be half of the supply voltage.

At block 706, the VCO can generate a VCO clock signal having an output frequency corresponding to the input voltage. Responsive to the input voltage, the VCO can generate the VCO clock signal having a frequency that corresponds to its expected frequency during operation of the tunable PLL when the tunable PLL is considered "locked."

At block 708, the input clock signal can be compared to the VCO clock signal. In an embodiment, the tunable PLL can include a controller having a tuning module that can be configured to compare various properties of the input clock signal to the VCO clock signal. The properties may include, but are not limited to, various features, positive edges, negative edges, and/or frequency.

At block 710, a number of positive edges (or other features) of the VCO clock signal can be determined during a cycle of the input clock signal. The tuning module can include a counter and an activation module that can be coupled together and can be configured to detect and measure properties of the VCO clock signal and/or the input clock signal. The properties may include, but are not limited to, positive edges, negative edges, features, transitions of a signal from a from a first state (low level) to a second state (high level) and vice versa.

The counter and the activation module can operate to measure the frequency of the input clock signal and the frequency of the VCO clock signal based in part on the measured properties of the respective signals. For example, the activation module can receive the input clock signal and generate a count enable signal responsive to the input clock signal. The input clock signal can include a plurality of pulses with each pulse having a positive edge and a negative edge. The activation module can detect a first positive edge in the input clock signal, and responsive to the first positive edge, the count enable signal can transition from a first state (e.g., low state) to a second, different state (e.g., high state). In some embodiments, the second state may correspond to an activation portion of the count enable signal.

The count enable can maintain the second state until a second (or subsequent) positive edge is detected in the input clock signal by the activation module. At the next or subsequent positive edge in the input clock signal, the count enable signal can transition from the second state to the first state. In some embodiments, the first state may correspond to a disable portion of the count enable signal.

In an embodiment, responsive to each positive edge in the input clock signal, the activation module can be configured to transition the count enable signal from the first state to the second state or from the second state to the first state. One cycle of the input clock signal can correspond to a time period between two consecutive positive edges in the input clock signal.

The activation module can transmit the count enable signal to the counter and the counter can be activated and/or disabled based in part on a state (or level) of the count enable signal. For example, alternating positive edges (e.g., first, third, fifth, etc.) in the input clock signal can correspond to activation portions in the count enable signal and activate the counter and different alternating positive edges (e.g., second, fourth, sixth, etc.) in the input clock signal can correspond to disable portions in the count enable signal and disable the counter. Stated differently, the counter can be enabled responsive to a positive edge of the input clock signal and disabled on the next or subsequent positive edge of the input clock signal.

The counter can be coupled to receive the VCO clock signal and during activation portions of the count enable signal (e.g., responsive to the first positive edge of the input clock signal), the counter can count or otherwise increment a count value for each positive edge detected in the VCO signal. For example, during one cycle of the input clock signal, the counter can count each positive edge detected in the VCO signal.

Responsive to the disable portion of the count enable signal, the counter can stop counting the positive edges of the VCO clock signal and store the count value. In some embodiments, the counter can round the count value to the nearest integer value. The count value is the number of positive edges the VCO clock signal produces in one cycle of the input clock signal. Thus, the count value corresponds to a ratio between a frequency of the VCO clock signal to a frequency of the input clock signal. In an embodiment, the count value can provide an estimate of the VCO clock signal divided by the input clock signal and can be used to generate a division ratio.

The accuracy of the count value can be impacted by the number of counts. For example, in some embodiments, as the number of counts increases, the accuracy of the count value increases as the act of counting can have an error very close to one count. In one embodiment having the VCO frequency set as approximately 10.9 times the frequency of the input clock, when the tuning stage commences, the count value is 10 as there will be 10 rising edges of the VCO clock in one cycle of the input clock during that one instance of counting. As seen the error in that count can be as high as 1 which happens to be true regardless of what the value of count is. In the case where count is 10 the error can be as high as 10% of the count value. However, with a count of 100 the error drops down to 1% of the count value. This is true for any time tuning occurs. Thus, as the number of counts increases, the accuracy of the count value increases.

In some embodiments, the accuracy of the count value can be determined based at least in part on generating a division ratio that enables the VCO of the tunable PLL operates within a predetermined range of frequencies for a predetermined error. For example, the effect of the error in counting can cause a shift from the reference voltage to the quiescent input voltage of the VCO during normal operation. Too much error may cause the input voltage of the VCO to saturate and the PLL would not work as intended. Therefore, the factors to be balanced include, but are not limited to: the error present in tuning due to counting, the bandwidth and tunable range of the VCO, and/or the magnitude of dithering. In an embodiment, the tunable PLLs described herein can be designed such that the magnitude of dithering could be met while accounting for the tunable range of the VCO and the possible error in tuning.

At block 712, a tuned division ratio can be generated corresponding to the ratio of the frequency of the VCO clock signal to the frequency of the input clock signal. The ratio can correspond to the relationship between the number of positive edges generated by the VCO clock signal during one cycle of the input clock signal. In an embodiment, the tuned division ratio can be approximately equal to the count value.

At block 714, a dithered division ratio can be generated that modulates the average value of the tuned division ratio by a predetermined dithering percentage. The tuning module can provide the tuned division ratio to a dither signal generator of the controller. In an embodiment, the dither signal generator can be configured to receive the tuned division ratio and generate a dither signal (referred to herein as a dithered division ratio) having a triangle shape based on the tuned division ratio. For example, the dither signal generator can apply dither across a predetermined percentage band (i.e., predetermined dithering percentage) about the tuned division ratio to form the dithered division ratio. The tuned division ratio can be an even integer value and provides a starting point for the dither division ratio. The dithered division ratio can increase (or linearly rise) and/or decrease (linearly fall) from an average value that corresponds to the tuned division ratio based on the predetermined dithering percentage.

The dither signal generator can include an accumulator and a first switch, both coupled to receive the tuned division ratio. The accumulator can receive the tuned division ratio and can apply a rate of change factor to the tuned division ratio to generate an accumulation constant. The rate of change factor or magnitude of dithering can be a preselected value (e.g., 10% dithering is decided before any other factors of the PLL design). In some embodiments, the value of the value of the accumulator constant, in addition to the rate of dithering, can be used to determine the magnitude of dithering. For example, in a design where +/−10% dithering is desired at a rate of 200 times slower than the input clock frequency then the value of the accumulator constant can be selected to be as Division ratio/500. In such an embodiment, after 50 counts, the dithered division ratio can change value by 50/500*division ratio or 10% of the division ratio.

In some embodiments, the accumulation constant can be selected such that it is a set fraction of the tuned division ratio. For example, in one embodiment, by selecting a dithering percentage of a first percentage (e.g., 10%), the accumulator constant can be set as a first fraction (e.g., 1/500) of the tuned division ratio. Thus, over a predetermined number of cycles (e.g., 50 cycles), the accumulator constant can increase the integrator output value by the first percentage (here 10%).

The accumulation constant can correspond to the amount the dither signal increases or decreases about its average value per cycle. The accumulator constant incrementally changes the tuned division ratio by a predetermined amount over time such that the tuned division ratio becomes a time varying signal having a triangle waveform, referred to herein as the dithered division ratio. In an embodiment, a predetermined percentage change in the tuned division ratio can cause the same or substantially similar percentage change in the frequency of the VCO clock signal and the value of the frequencies does not matter. Due to the negative feedback of the tunable PLL, the frequency of the VCO clock signal can follow the dithered division ratio. Thus, the frequency of the VCO clock signal is modulated by the dithered division ratio in the form of a feedback signal, which will be described in greater detail below.

An output of the accumulator can be coupled to inputs of first and second gain modules coupled in parallel with respect to the output of the accumulator. The first gain module can be a positive gain amplifier and the second gain module can be a negative gain amplifier. The first gain module can receive the accumulation constant and apply a positive gain value (e.g., 1) to generate a positive accumulation constant and the second gain module can receive the accumulation constant and apply a negative gain value (e.g., −1) to generate a negative accumulation constant.

The outputs of the first and second gain modules can be coupled to first and second terminals of a switch. The switch can include first, second and third terminals, with the third terminals correspond to an output terminal. The switch can transition between first and second terminals at a predetermined rate to generate alternating positive and negative accumulation constant at its respective third terminal. The predetermined rate can be selected based at least in part on the desired dither rate. For example, in one embodiment, in which the dither rate is set to be 200 times slower than the input clock frequency, the switch can transition every 100 cycles of the feedback clock. The first transition after tuning can occur 50 cycles after the PLL is tuned. In such an embodiment, the average dithered division ratio can be approximately equal to the division ratio. Thus, the switch can transition after a predetermined time using the counter.

The third terminal of the switch can be coupled to a first input of an adder. A second input of the adder can be coupled to an output of the dither signal generator to receive the current output of the dither signal generator. In an embodiment, the adder can be configured to apply the positive or negative accumulation constant to the current output of the dither signal generator to generate an incremented output signal, referred to herein as an adder signal. The adder signal can be the previous output signal increased or decreased by the value of the positive or negative accumulation constant. For example, to generate a triangle wave, the accumulation constant can alternate from positive to negative values. Thus, the alternating positive and negative accumulator constant values can be applied to the current output of the dither signal generator to give the adder signal and thus, the output of the dither signal generator a generally triangular shape.

An output of the adder can be coupled to a first terminal of an initial condition switch to provide the adder signal. A second input of the initial condition switch can be coupled to receive the tuned division ration.

The initial condition switch can include first, second, and third terminals with the third terminal corresponding to an output terminal. The initial condition switch can at a first time period (or initial period) be configured such that the second terminal is coupled to the third terminal to provide the tuned division ratio to the third terminal. For example, initially, the dither signal generator can output the tuned division ratio as a first or initial output. After a predetermined time, the initial condition switch can transition such that the first terminal is coupled to the third terminal and provide the adder signal to the third terminal.

The third terminal of the initial condition switch is coupled to an input of an integrator. The integrator can include a unit delay and a feedback clock. The integrator can be configured to hold and delay the tuned division ratio or the adder signal for a predetermined time based on a feedback clock signal. In some embodiments, the feedback clock signal can correspond to the input frequency of an input clock signal. For example, the feedback clock can be very close to the input clock in terms of frequency and phase when the PLL is locked. The feedback clock can be selected over the input clock to drive most of the digital controller for timing reasons.

For example, the output of the integrator can be the dither signal and the rate of integration or the speed at which the integrator outputs new values, and thus the frequency of the dither signal can correspond to the input frequency of an input clock signal. In some embodiments, the frequency of the dither signal can be maintained at a rate that is a percentage of the input frequency of the input clock signal (e.g., 200 times slower than a frequency of the input frequency to the tunable PLL. In some embodiments, this rate can be used to set the number of clock cycles used to integrate as a constant (e.g., accumulation constant).

In an embodiment, when the tunable PLL is tuned or "locked", the integrator can be provided the average division ratio as an initial condition. The integrator then changes its value around this point (e.g., the tuned division ratio), to maintain the dither signal such that it has an average value that is the same as or substantially close to the tuned division ratio.

The output of the integrator can be coupled to an input of a sigma delta generator of the controller. The sigma delta generator can provide quantization of the dithered division ratio. The dithered division ratio can be quantized to strictly integer values. The sigma delta modulator may also shape any added quantization noise which can be filtered by the PLL loop.

The changes (e.g., accumulation constant, dither) injected into the tuned division ratio to generate the dithered division ratio can result in noise being added to the signal. The sigma delta generator can be configured to provide noise shaping. For example, the sigma delta generator can push noise generated by the dithered division ratio or responsive to the dithered division ratio to higher frequencies, such as greater than a frequency threshold of the loop filter of the tunable PLL. Thus, the noise generated by the dithered division ratio can be filtered out. In some embodiments, the signal delta generator can be configured to implement fractional division ratios as a string of integers.

At block 716, a feedback signal can be generated corresponding to the dithered division ratio. A first input of a feedback module can be coupled to an output of the sigma delta generator and be coupled to receive the dither signal from the sigma delta generator. A second input of the feedback module can be coupled to an output of the VCO to receive the VCO clock signal.

The feedback signal can be a fractional frequency multiple of the input clock signal can be generated by the VCO. In an embodiment, using the feedback signal, the VCO clock signal can be generated at any frequency regardless of the frequency of the input clock signal by selecting a correct fractional division ratio. For example, the feedback module can apply the dither signal to the VCO clock signal to generate the feedback signal. In an embodiment, the feedback signal can be a frequency multiple of the input clock signal. Thus, the VCO clock signal (or output of the VCO) can be maintained as integer multiples of the input clock signal by applying the feedback signal back into the tunable PLL.

Due to the negative feedback of the tunable PLL, the frequency of the VCO clock signal can follow the feedback signal that is generated based in part on the dithered division ratio. Thus, the frequency of the VCO clock signal is modulated by a time varying signal having a triangle waveform, referred to herein as the feedback signal.

The tunable PLL can include an output module coupled to receive the VCO clock signal. The output of the output module can be a dithered version of the input clock signal. Although, the input clock signal and the output signal may be at different frequencies at a given time, due to the dithering, the average frequency of the input clock signal and the output signal can be the same or substantially similar.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A tunable fractional phased lock loop (PLL) comprising:
    a phase detector configured to receive an input clock signal having a range of input frequencies and a feedback signal, wherein the phase detector generates an error signal corresponding to a phase difference between the input clock signal and feedback signal;
    a voltage controller oscillator (VCO) configured to receive the error signal from said phase detector and in response thereto to generate a VCO clock signal;
    a controller configured to receive the input clock signal and the VCO clock signal and to generate a dithered division ratio having an average value corresponding to a ratio of a number of edges of the VCO clock signal generated in a cycle of the input clock signal; and
    a feedback module configured to receive the VCO clock signal and the dithered division ratio and in response thereto generates a feedback signal to tune the PLL such that the PLL operates in the range of input frequencies of the input clock signal.

2. The PLL of claim 1, further comprising a loop filter disposed in a signal path between the phase detector and the VCO, the loop filter configured to receive the error signal and generate a filtered signal.

3. The PLL of claim 2, further comprising a charge pump disposed in a signal path between the phase detector and the loop filter.

4. The PLL of claim 2, wherein the loop filter comprises at least one resistive element, at least one capacitive element or a combination of both.

5. The PLL of claim 1, further comprising an output module coupled to an output of the VCO, the output module configured to divide the VCO clock signal to a relative frequency within the range of input frequencies of the input clock signal.

6. The PLL of claim 1, wherein the controller further comprises a tuning module configured to receive the input clock signal and the VCO clock signal and generate a tuned division ratio corresponding to the ratio between the number of edges of the VCO clock signal generated in the cycle of the input clock signal.

7. The PLL of claim 6, wherein the controller further comprises a dither signal generator configured to receive the tuned division ratio and generate the dithered division ratio, wherein the dithered division ratio modulates a predetermined percentage above the average value corresponding to the ratio between the number of edges of the VCO clock signal generated in the cycle of the input clock signal.

8. The PLL of claim 7, wherein the controller further comprises a sigma delta modulator configured to receive the dithered division ratio, and wherein the sigma delta modulator is configured to implement fractional division ratios and provide noise shaping on the dithered division ratio.

9. A phased lock loop controller comprising:
a tuning module configured to generate a generate a tuned division ratio corresponding to a ratio between a number of edges of a voltage controller oscillator (VCO) clock signal generated in a cycle of an input clock signal;
a dither signal generator configured to receive the tuned division ratio and generate a dithered division ratio that alternates between a positive direction and a negative direction about an average value of the tuned division ratio by a predetermined percentage value, wherein the dither signal generator further comprises an accumulator module and an integrator; and
a sigma delta modulator configured to receive the dithered division ratio and generate an output signal corresponding to the dithered division ratio.

10. The controller of claim 9, wherein the tuning module further comprises an activation module and a counter, wherein the activation module is configured to receive the input clock signal and the counter is configured to receive the VCO clock signal.

11. The controller of claim 10, wherein the activation module is configured to the counter and the activation module is configured to activate the counter responsive to a first positive edge of the input clock signal and disable the counter responsive to a second positive edge of the input clock signal.

12. The controller of claim 10, wherein the counter is configured to count a number of positive edges in the VCO clock signal corresponding to the cycle of the input clock signal.

13. The controller of claim 9, wherein the accumulator module is configured to generate an accumulation constant and the integrator is configured to linearly ramp the tuned division ratio responsive to the accumulator constant.

14. A method for tuning a phased lock loop, the method comprising:

receiving, at a phase detector, an input clock signal and a feedback signal, wherein the input clock signal includes an input voltage and a range of input frequencies;
receiving, at a voltage controlled oscillator (VCO) from the phase detector, an error signal corresponding to a phase difference between the input clock signal and the feedback signal;
generating, by the VCO, a VCO clock signal having an output frequency corresponding to the input voltage; and
comparing the input clock signal to the VCO clock signal, wherein comparing further comprises:
determining a number of edges of the VCO clock signal generated during a cycle of the input clock signal;
generating a tuned division ratio corresponding to a ratio between the number of edges of the VCO clock signal generated during the cycle of the input clock signal;
generating, by a dither signal generator, a dithered division ratio that modulates an average value of the tuned division ratio a predetermined percentage value, wherein the dither signal generator further comprises an accumulator module and an integrator; and
generating a feedback signal corresponding to the dithered division ratio, wherein the feedback signal tunes the PLL to the range of input frequencies of the input clock signal.

15. The method of claim 14, further comprising maintaining the input voltage at a constant level to maintain the VCO clock signal within the VCO frequency range.

16. The method of claim 14, further comprising, responsive to a first positive edge of the input clock signal, initiating counting of a number of positive edges of the VCO clock signal generated during the cycle of the input clock signal, and responsive to a second positive edge of the input clock signal, stopping counting of the number of positive edges of the VCO clock signal.

17. The method of claim 16, wherein the number of positive edges of the VCO clock signal in one cycle of the input clock signal corresponds to a ratio of the VCO clock frequency to the input signal frequency.

18. The method of claim 14, further comprising generating an accumulator constant corresponding to the predetermined percentage value, wherein the accumulator constant alternates from a positive to a negative value.

19. The method of claim 18, further comprising linearly ramping the tuned division ratio using the accumulator constant to generate the dithered division ratio.

20. The method of claim 19, wherein the dithered division ratio includes a triangular waveform that alternates from a positive value to a negative value about the average value of the tuned division ratio.

21. The method of claim 18, wherein the accumulator constant is a fraction of the average value of the tuned division ratio.

22. A tunable fractional phased lock loop (PLL) comprising:
a means for detecting configured to receive an input clock signal having a range of input frequencies and a feedback signal, wherein the means for detecting generates an error signal corresponding to a phase difference between the input clock signal and feedback signal;
a means for filtering configured to receive the error signal and generate a filtered signal;

a means for generating configured to receive the filtered signal and generate a VCO clock signal corresponding to the filtered signal;

a means for controlling configured to generate a dithered division ratio having an average value corresponding to a ratio between a number of edges of the VCO clock signal generated in a cycle of the input clock signal, wherein the means for controlling includes a dither signal generator that comprises an accumulator module and an integrator; and the feedback means configured to receive the dithered division ration and generate a feedback signal to tune the PLL to the range of input frequencies of the input clock signal.

23. The PLL of claim 22, further comprising a charge pump disposed in a signal path between the means for detecting and the means for filtering.

24. The PLL of claim 22, wherein the means for filtering comprises at least one resistive element, at least one capacitive element or a combination of both.

25. The PLL of claim 22, further comprising an output module coupled to an output of the means for generating, wherein the output module is configured to divide the VCO clock signal down to at least one input frequency of the range of input frequencies of the input clock signal.

26. The PLL of claim 22, wherein the means for controlling further comprises a means for tuning configured to receive the input clock signal and the VCO clock signal and generate a tuned division ratio corresponding to the ratio between a number of edges of the VCO clock signal generated in a cycle of the input clock signal.

27. The PLL of claim 26, wherein the means for controlling further comprises a means for signal generation configured to receive the tuned division ratio and generate the dithered division ratio, wherein the dithered division ratio modulates a predetermined percentage above the average value corresponding to a ratio between a number of edges of the VCO clock signal generated in a cycle of the input clock signal.

28. The PLL of claim 27, wherein the means for controlling further comprises a sigma delta modulator configured to receive the dithered division ratio, and wherein the sigma delta modulator is configured to implement fractional division ratios and provide noise shaping on the dithered division ratio.

* * * * *

UNITED STATES PATENT AND TRADEMARK OFFICE
CERTIFICATE OF CORRECTION

PATENT NO. : 10,236,899 B1
APPLICATION NO. : 15/902172
DATED : March 19, 2019
INVENTOR(S) : Mackenzie Tope et al.

Page 1 of 3

It is certified that error appears in the above-identified patent and that said Letters Patent is hereby corrected as shown below:

On the Title Page

Abstract, delete "to generates" and replace with --to generate--

In the Specification

Column 2, Line 51, delete "generate a generate a" and replace with --generate a--

Column 2, Lines 65-66, delete "The activation module can be configured to the counter and the activation module is configured to" and replace with --The activation module can be configured to--

Column 3, Line 34, delete "VOC" and replace with --VCO--

Column 4, Line 3, delete "division ration" and replace with --division ratio--

Column 5, Line 20, delete "within at a" and replace with --within a--

Column 5, Line 63, delete "terminal is resistive" and replace with --terminal of resistive--

Column 6, Line 1, delete "combination of" and replace with --combinations of--

Column 6, Line 44, delete "cock signal" and replace with --clock signal--

Column 6, Line 47, delete "cock signal" and replace with --clock signal--

Column 7, Line 19, delete "module 222 include an" and replace with --module 222 includes an--

Signed and Sealed this
Sixteenth Day of July, 2019

Andrei Iancu
*Director of the United States Patent and Trademark Office*

CERTIFICATE OF CORRECTION (continued)
U.S. Pat. No. 10,236,899 B1

Column 7, Line 40, delete "module 226" and replace with --module 224--

Column 8, Line 30, delete "302a" and replace with --303a--

Column 8, Line 27, delete "Third pulse 302a" and replace with --Third pulse 302c--

Column 9, Line 40, delete "first 314" and replace with --first state 314--

Column 9, Line 45, delete "ration" and replace with --ratio--

Column 9, Lines 48-49, delete "that counter division" and replace with --that division--

Column 9, Line 55, delete "is disable" and replace with --is disabled--

Column 10, Line 27, delete "Dither" and replace with --dither--

Column 10, Line 45, delete "first and gain" and replace with --first and second gain--

Column 10, Line 51, delete "405 generate" and replace with --405 to generate--

Column 11, Line 41, delete "First switch can" and replace with --First switch 414 can--

Column 11, Line 62, delete "first switch 416" and replace with --first switch 414--

Column 13, Line 64, delete "from a from a first" and replace with --from a first--

Column 14, Line 13, delete "count enable can" and replace with --count enable signal--

Column 14, Line 65, delete "set as" and replace with --set at--

Column 15, Line 19, delete "limited to:" and replace with --limited to,--

Column 15, Line 47, delete "provides a" and replace with --provide a--

Column 15, Line 62, delete "+/-10%" and replace with --+/- 10%--

Column 15, Line 65, delete "as Division ratio" and replace with --as division ratio--

Column 16, Line 41, delete "terminals correspond" and replace with --terminals corresponding--

Column 17, Line 7, delete "division ration" and replace with --division ratio--

Column 17, Line 38, delete "(e.g. 200 times" and replace with --(e.g. 200 times)--

Column 18, Line 9, delete "signal can" and replace with --signal and can--

In the Claims

Column 19, Line 32, delete "generate a generate a tuned" and replace with --generate a tuned--